Nov. 24, 1970 E. J. RICE 3,542,551

METHOD OF ETCHING PATTERNS INTO SOLID STATE DEVICES

Original Filed June 30, 1967 4 Sheets-Sheet 1

INVENTOR
EDWARD J. RICE,

BY HIS ATTORNEYS.
Spensley & Horn.

Nov. 24, 1970 E. J. RICE 3,542,551

METHOD OF ETCHING PATTERNS INTO SOLID STATE DEVICES

Original Filed June 30, 1967 4 Sheets-Sheet 2

EDWARD J. RICE
INVENTOR.

BY Spensley & Horn
ATTORNEYS

Nov. 24, 1970 E. J. RICE 3,542,551

METHOD OF ETCHING PATTERNS INTO SOLID STATE DEVICES

Original Filed June 30, 1967 4 Sheets-Sheet 3

INVENTOR.

EDWARD J. RICE,

By His Attorneys

Spensley & Horn.

EDWARD J. RICE
INVENTOR.
BY Spensley & Horn
ATTORNEYS

United States Patent Office 3,542,551
Patented Nov. 24, 1970

3,542,551

METHOD OF ETCHING PATTERNS INTO SOLID STATE DEVICES

Edward J. Rice, Los Angeles, Calif., assignor to TRW Semiconductors, Inc., Lawndale, Calif., a corporation of Delaware Continuation of application Ser. No. 650,394, June 30, 1967. This application July 1, 1968, Ser. No. 752,537
Int. Cl. G03c *5/00*
U.S. Cl. 96—36.2 19 Claims

ABSTRACT OF THE DISCLOSURE

An improved method for fabricating solid state devices using photoresist etching techniques wherein a simplified method of utilizing photoresist masks is employed. Two or more individual patterns are put onto a single photoresist mask with high precision. The multiple pattern is transferred to a photoresist layer disposed on top of a protective layer such as silicon dioxide, ethyl silicate, or silicon nitride which is itself disposed upon a semiconductor wafer. The transfer is accomplished using current photoresist technology. The multiple patterns are exposed and the protective layer beneath the unexposed photoresist layer is partially etched away. A second photomask is then employed which need be only crudely aligned with the original pattern as partially etched. This second mask covers all elements of the original pattern except that element or elements which can be completely etched through until the underlying semiconductor surface is exposed. A diffusion step can then be undertaken with the exposed semiconductor surface. A third mask is then imposed upon the wafer. This mask completely covers the completed element which has just been diffused and uncovers another element of the original pattern which can now also be etched completely through until the underlying semiconductor surface is exposed. In an alternative embodiment the protective layer can be completely etched through to the silicon in all elements of the multiple pattern, then a second protective layer is deposited over the wafer including the recesses made by the etching of the first pattern. A second photomask is then employed. This photomask covers all the elements etched in the first etching operation except one, and this element may now be etched all the way through the second protective layer until the underlying semiconductor material is exposed. A diffusion step can then be undertaken. A third photomask may then be employed which need be only crudely aligned with the patterns etched by the first two masks and which covers the element which has been diffused and allows etching of the other element through the second protective layer to expose the underlying semiconductor surface. This area may then be subjected to a diffusion step. This process may be repeated across the entire width of the wafer thus facilitating production of hundreds of devices by the use of only three or four photomasks.

This application is a continuation of copending application Ser. No. 650,394, filed June 30, 1967, now abandoned.

BACKGROUND OF THE INVENTION

Field of the invention

This invention relates to a new method of etching multiple patterns into a semiconductor device. More particularly, the invention relates to an improved method of utilizing photoresist techniques and to an improved method of aligning photoresist masks to produce a multiplicity of patterns on a semiconductive wafer.

Description of the prior art

To improve the uniformity and reliability of solid state components and to reduce their cost of manufacture, it is desirable that they be produced and processed in large numbers simultaneously. It has been the practice of the prior art as, for example, in the production of solid state devices, such as planar and mesa transistors, to produce thousands of these devices in a single wafer of semiconductive material using a multistep photomechanical reproduction process. The prior art technique for fabricating devices in this manner has been to use a series of masks, each containing a repetitive array of a single element of the multiple element array required for fabrication of the device, and then by a succession of alignment and fabricating steps to construct the finished product. A mask is normally used as a negative to expose a thin film of photosensitive material previously deposited on the wafer of semiconductive material in which the semiconductor devices are to be constructed. Upon development, the unexposed photoresist material is dissolved away, but the exposed photoresist remains in place to act as a selective mask against the action of various chemical etchants. The steps in manufacturing a planar double diffused silicon transistor using prior art techniques are described as follows.

The first step, given a suitable wafer of single crystal silicon, is thermally to grow on the wafer an oxide layer roughly one micron thick. Next, the photosensitive resist material such, for example, as Kodak Photo Resist (KPR), is applied over the oxide and the surface is selectively exposed through a photomask of the type described to define a plurality of individual base diffusion areas. The wafer is chemically processed to remove the unexposed resist materials from over the base areas. The underlying oxide is then removed by an acid etch, such as by hydrofluoric acid, the resist material defining the areas around the base areas not being attacked. The resist overlay is next removed and base diffusion is performed using, for example, a boron compound. Diffusion is restricted to the exposed silicon surface by the oxide overlay. Oxide is regrown or deposited over the base region during the diffusion process. The emitter area is defined by a second photomasking and etching process similar to that just described, the emitter diffusion being carried out using a phosphorous compound, the oxide again masking all but the desired region. A third photomasking etching operation defines the base contact regions after which aluminum or other suitable contact material is evaporated over the wafer to form the contact. Another and final photomasking step is used to remove the aluminum from the unwanted areas. The described prior art process requires as a minimum the use of four high precision photomasks, each of which is difficult to make and each of which must be placed in accurate registration with a pattern laid down by the previous mask in order to produce a satisfactory end product. The problem of avoiding accumulation of error is both difficult and expensive and one whose difficulty is directly proportional to the number of patterns required for reproduction. The problem is particularly aggravated by the precise dimensional control which must be maintained during successive mask alignments.

Another prior art technique for manufacturing semiconductor devices is the so-called "overlay" method wherein a base region is first diffused in a wafer; ethyl silicate is deposited on the wafer and then an emitter region is etched and diffused and a P+ region is etched and diffused. Region geometries and spacing are extremely critical in this method and line widths and spacing must be carefully controlled. The double etch photoresist masking technique described herein is particularly advantageous for the production of semiconductor devices produced by this method.

It is, accordingly, a primary object of this invention to provide a method of etching a multiplicity of patterns into a wafer without requiring the precise alignment of more than one photomask.

It is another object of the present invention to provide a method of etching patterns using photoresist techniques whereby a multiplicity of patterns is provided by one mask and whereby a second mask can be used but need not be precisely aligned with the first mask.

Yet another object of the present invention is to provide a method of applying multiple patterns to a semiconductive wafer across the entire width of said wafer without the necessity for precisely aligning images in successive masks with areas provided by prior masks.

SUMMARY OF THE INVENTION

The invention comprises a sequential registration scheme for the etching of semiconductor devices using photomasking techniques comprising the steps of providing a photomask having a composite array of element images to be etched into a semiconductive material; placing the mask on a photosensitized surface which covers a protective layer imposed upon a wafer of semiconductive material; and exposing the light sensitized surface through the mask, thereby leaving unexposed the element images to be etched. The unexposed areas of photosensitized surface are then removed. The areas being removed correspond to element images to be etched. The areas corresponding to element images are then etched until a predetermined amount of a protective oxide layer material has been removed, and several recess have been etched into the protective layer. A second photomask is then transferred on the first pattern, the second photomask being aligned with the first pattern with relatively crude accuracy. The second photomask covers predetermined portions of the original pattern while leaving selected elements exposed for further etching. The area defined by the second pattern is then etched until the remaining underlying protective layer is removed, thereby exposing the semiconductive material for further diffusion processes. A third photomask is then transferred onto the wafer with crude accuracy such that the previously etched and processed element is covered and another partially etched element is exposed for further etching. The protective layer within the exposed element is then removed by etching until the underlying semiconductor surface is exposed. A diffusion step can then be performed, The advantages of the invented photoresist masking method is that it is no longer necessary to sequentially align several photomasks with extreme accuracy. A first photomask having thereupon a composite array of element images to be reproduced can be aligned upon a wafer of semiconductive material in a noncritical manner. The second and subsequent photomasks employed need only be aligned with crude accuracy (approximately 0.0001 inch) with elements previously etched in the first masking and etching operation. This makes possible the use of photomasks having thereupon multiple images to be produced, which images can be imposed upon the photomask with all the accuracy and precision available in the photomask art. The multiple images are thus much more accurately reproduced upon a photoresist layer than would be possible by sequentially aligning separate masks upon the photoresist layer.

The novel features which are believed to be characterisitc of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and not intended as a definition of the limits of the invention.

DESCRIPTION OF THE PREFERRED EMBODIMENTS

Figure 1:
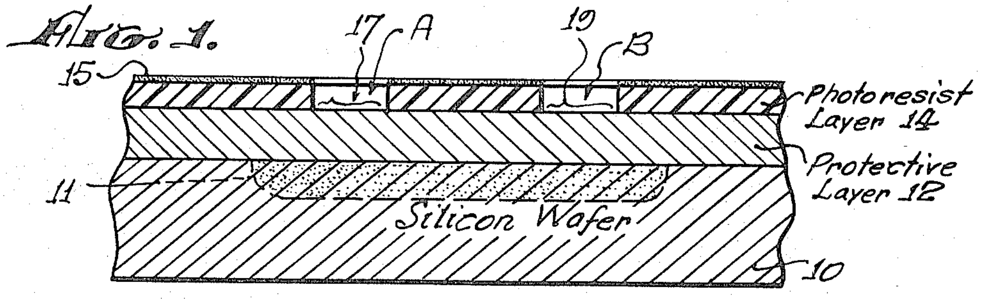
FIGS. 1, 2, 3, 4, 4*a*, 4*b*, 4*c*, and 4*d* illustrate in diagrammatic form the process of etching patterns by sequentially applying photomasks to a protective layer and etching the pattern therein.

The method of the invention will be better understood with reference to the above mentioned figures. Referring now to FIG. 1, there is shown a semiconductor crystal 10 on which a base region 11 has been created on the upper surface by known methods, such as the photolithographic techniques described in the preceding description of the prior art. The specific forming of the base region 11 does not per se form a part of the present invention but is shown for the purposes of describing a preferred embodiment.

After the base region 11 has been formed in the upper surface of the crystal 10, a layer of ethyl silicate is deposited on the crystal and heated to convert it to a glass coating 12, which then serves as a protective layer. A photoresist layer 14 is then deposited by standard photolithographic techniques. A suitable photoresist layer is Kodak Photo Resist (KPR) manufactured by the Eastman Kodak Company.

The method of the present invention utilizes a photomask 15 having a composite array of element images which are the progenitors of the areas to be etched into the protective layers covering the semiconductive wafer. Thus, if two such areas are contemplated such as, for example, an emitter diffusion and the diffusion of a P+ stripe, the mask contains two images (A and B in FIGS. 1, 2 and 5) precisely spaced which then reproduced will correspond to the emitter area and the P+ stripe. It should be understood that more or less than two images may be reproduced by this method and for various functions other than P+ regions and emitter diffusions.

The photomask 15 is placed in alignment upon the wafer of semiconductive material 10 and disposed upon photoresist layer 14 in FIG. 1. The mask can be held in position by any standard mechanical means. When the photomask is in position images A and B are precisely in register upon the photoresist layer. Upon exposure of the photomask the photoresist layer 14 beneath images A and B remains unexposed so that these areas can subsequently be removed by etching. It will be understood, of course, that a great number of such images arranged in composite arrays are simultaneously produced across the width of a wafer. The portions of the pattern which comprise the opaque parts of the photomask are used to generate in the photosensitive layer unexposed areas which can be removed by etching in subsequent steps.

After exposing the photomask to light it is removed leaving photosensitive layer 14 exposed in the areas that are not to be etched, the semiconductor device at this stage of fabrication appearing substantially as shown in FIG. 1. For ease in understanding the invention, FIG. 1 shows the photomask 15 superimposed over photosensitive layer 14 after images A and B have been etched away from layer 14. However, it should be understood that in practice the photomask 15 is removed after exposure and before etching images A and B into layer 14 and the configuration shown in FIG. 1 is only for purposes of illustration. The unexposed areas of the resist layer conform to the P+ and emitter diffusion areas designated A and B herein. The resist layer can then be removed from these areas by solvents.

Figure 2:
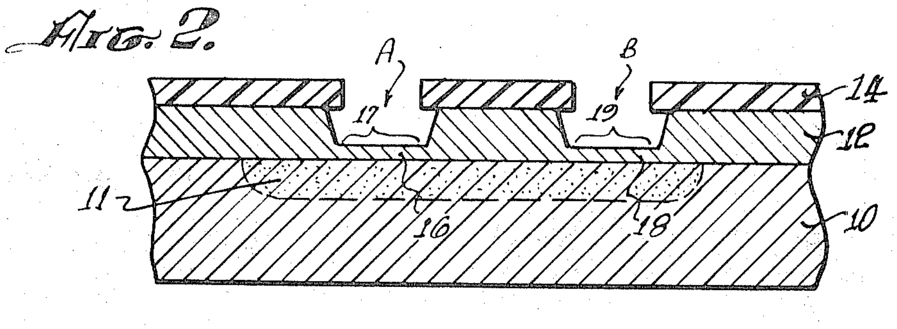

When the unexposed areas of the resist layer have been removed the underlying oxide layer 12 can be etched away to any desired depth using standard etching techniques. Such standard etchants include hydrofluoric acid. The photoresist coating that has been exposed by light is not affected by the chemical etchant, thus, only the oxide layer corresponding in areas to the images in the photomask unexposed on the photoresist area are removed by etching. This etching step is carried out until a predetermined amount 16 and 18 of protective layer 12 remains after etching at the locations A and B, the partially completed device then appearing as shown in FIG. 2. Thus, recesses corresponding to images A and B in the photomask are produced in protective layer 12. These recesses formed by the etchant in the protective layer 14 have planar bottoms with predetermined cross sectional areas 17 and 19 corresponding to the cross sectional areas of images A and B in the photomask. It is extremely important for the performance of a semiconductor device that these precise cross sectional areas be maintained into the diffusion steps and that such cross sectional areas of the semiconductive wafer are exposed for diffusions. In prior art methods subsequent masking and etching steps can easily produce small errors in alignment which result in corresponding changes in the cross sectional areas of the semiconductor device that are exposed. This in turn later effects the electrical characteristics of the device.

The original photoresist layer 14 can next be removed by standard solvents and a new photoresist layer 24 is applied to the surface upon protective layer 12.

Figure 3:
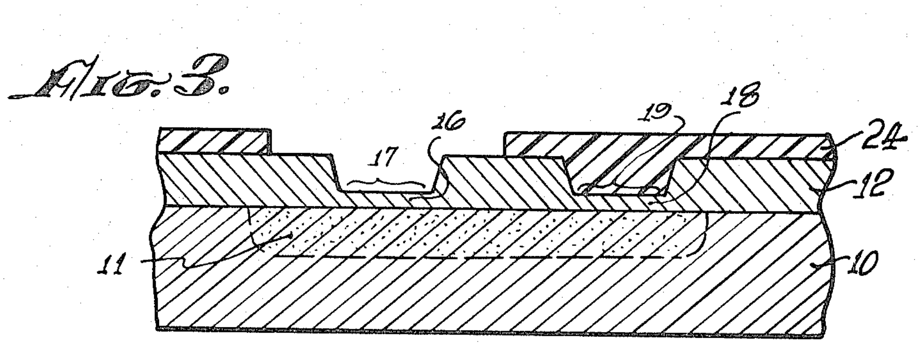
Figure 4:
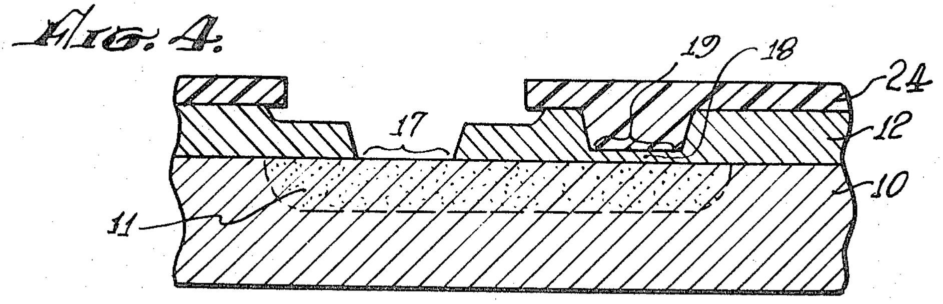

A second photomask is next imposed upon the new photoresist layer which in turn is located upon protective layer 12. The pattern on the second photomask coincides with and complements the first image A etched into the protective layer 12. However, the recess at B is covered by the second photomask so that no etchant will penetrate into recess B during an etching step. It is a significant aspect of the present invention that the second photomask need not be precisely aligned with the first image A but need only be crudely aligned to within approximately .0001 inch. This is so because the recess A etched into protective layer 12 by the first etching has already proceeded to a point at which the cross sectional area of the planar bottom has been established. If now a second etching step is undertaken the remaining portion 16 of protective layer 12 will be removed by etching in the second etching step and the precise cross sectional area of image A will be retained and this cross sectional area will be exposed on the surface of the semiconductive wafer. No etching, however, will take place at recess B. In preparation for this second etching step the second photomask is exposed to light. The image is thus transferred to the photoresist layer such that the photoresist layer is unexposed in the image area that is to be removed by etching. The unexposed photoresist is then removed with solvents, the device then appearing as shown in FIG. 3. Then the underlying area 16 of protective layer 12 is removed by standard etching techniques, thereby exposing the underlying silicon substrate 10. The device will then appear as shown in FIG. 4. The cross sectional area 17 of the recess at A is precisely the same as that of image A in the original photomask because the recess was already partially formed when the second etching step took place. Thus, the complete pattern "A" necessary for an emitter diffusion can be produced by the use of two photomasks, the second of which need only be roughly aligned with the image A generated by the first mask. This element of the pattern can, of course, be reproduced across the entire width of a wafer by a single application of the first and second photomask.

Figure 4A:
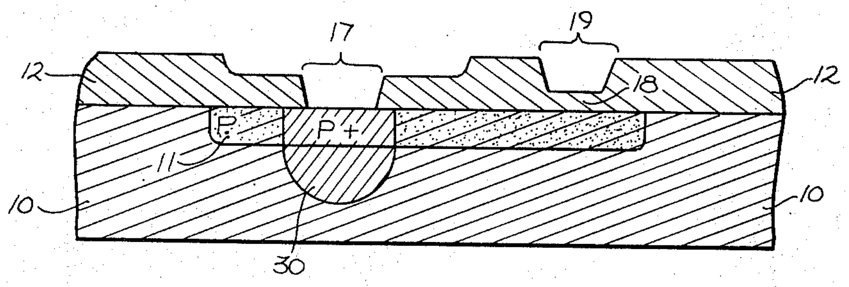

After the area corresponding to A has been exposed in the semiconductor wafer 10 underlying the protective layer 12, the photoresist layer 24 is removed and a diffusion step such as with boron may be undertaken. The diffusion may form a P+ area 30, for example, in the area corresponding to A (see FIG. 4*a*). The operation performed on the exposed area corresponding to A will comprise the establishment of a junction within the semiconductor wafer 10. A junction shall be understood to mean the interface of materials of different type conductivity, i.e., P type and N type, or the interface of materials of the same type conductivity but of differing concentrations, i.e., P type and P+ type.

Figure 4B:
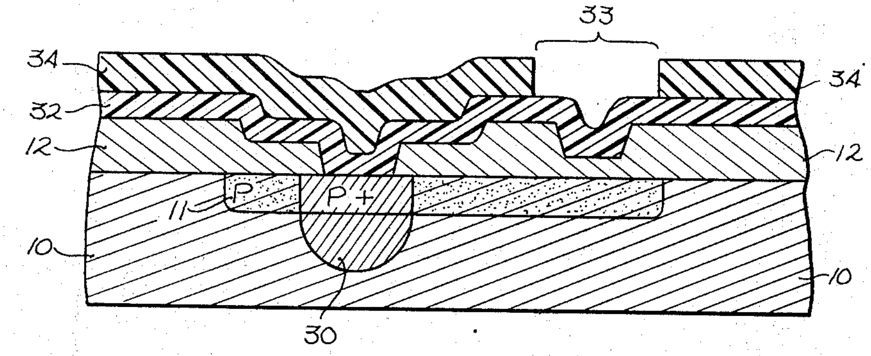

Next, another protective layer 32 is deposited over the protective layer 12, the layer 32 also covers the exposed area on the wafer 10 corresponding to A, as shown in FIG. 4*b*. A photoresist layer 34 is deposited and by use of standard photolithographic techniques, an opening 33 is produced in the photoresist layer and the area corresponding to B, but covering the area corresponding to A. The alignment of the third photomask again is accomplished by rather crude alignment since the image to be etched has been previously defined in the protective layer 12 (see FIG. 4*b*).

A suitable etching step is performed and the remaining portion of underlying area 18 is removed thereby causing the cross sectional area 19 of the recess B to be precisely the same as that of image B, since the recess for B has already been partially formed in the first protective layer 12.

The photoresist layer 34 is then removed when a diffusion step may be carried out with phosphorous or any other suitable dopant. This latter diffusion may form an N+ area 36, for example, in the area corresponding to B (see FIG. 4*d*). Thus, a P+ conduction stripe 30 and an emitter region 36 were diffused using 3 photolithographic steps in which the final two photomasks were only crudely aligned with the recesses etched in the first protective layer and defined by the original photomask. Cross-sectional areas 17 and 19 correspond to images A and B in the original photomask and are precisely reproduced on the surface of wafer 10.

Figure 5:
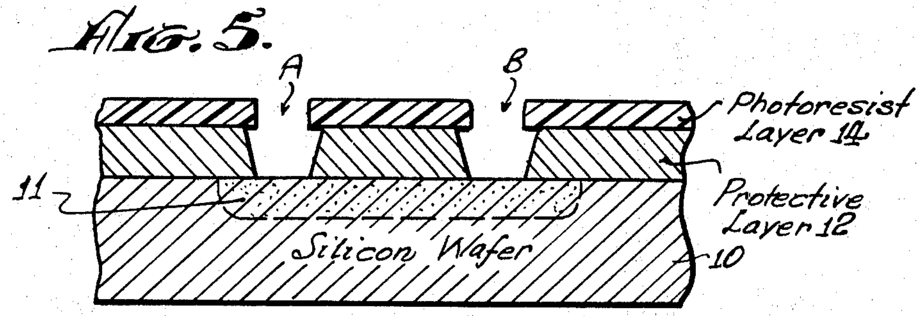
FIGS. 5, 6, 7, 7*a*, 7*b*, 7*c* and 7*d* illustrate in diagrammatic form an alternate embodiment for a process of etching patterns by sequentially applying photomasks to protective layers.
Figure 6:
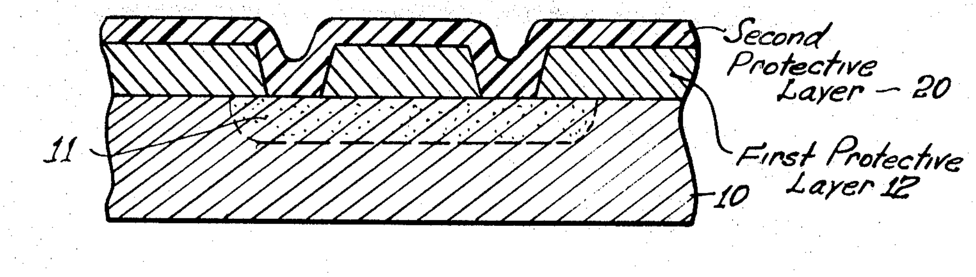
Figure 7:
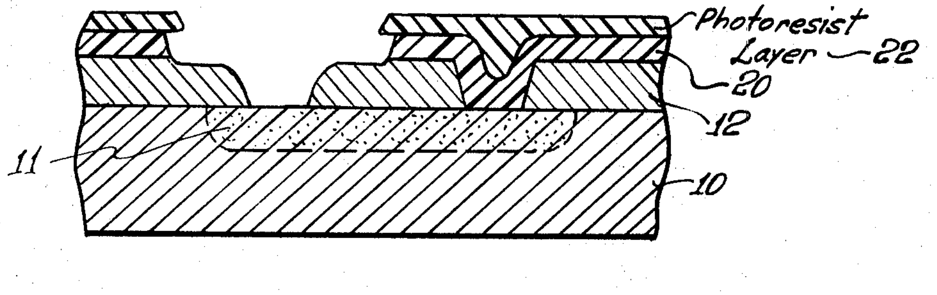

Referring now to FIGS. 5, 6, and 7 there is shown an alternative embodiment of the present invention wherein a base diffusion has previously been accomplished. A first photomask can be placed over a photoresist layer 14 as previously described. The photomask can have two patterns A and B precisely spaced relative to one another and having the required cross sectional areas. After light exposure of the photomask, areas corresponding to patterns A and B are left unexposed in the photoresist layer 14. The unexposed photoresist is removed from the wafer with solvent and the areas of underlying protective layer (generally thermally grown silicon dioxide or ethyl silicate) are etched by standard etchants and etching techniques. Thus, recesses A and B are formed in the protective layer. In this alternative embodiment of the invention, the recesses A and B in protective layer 12 are etched until the underlying surface of silicon wafer 10 is exposed, the device then appearing as shown in FIG. 5.

Next, a shallow protective layer 20 is deposited or grown over the whole wafer including slots A and B previously etched therein. This protective layer is generally silicon dioxide which can be vacuum deposited over the first protective layer 12 and over the exposed silicon wafer surface in slots A and B, the device then appearing as shown in FIG. 6. In some cases it is advantageous to dope the protective layer with either P or N type dopant. The protective layer can then serve as a source of dopant for a subsequent diffusion.

A second photoresist layer 22 is next applied to the wafer. A second photomask is then applied over photoresist layer 22 and need only be crudely aligned with recesses A and B. The second photomask is so constructed that the recess at B is covered while the recess at A is open for further etching. The second protective layer 20 at recess A can then be removed by standard etching techniques until the surface of silicon wafer 10 is exposed for the diffusion step the device then appearing as shown in FIG. 7. Recess A now provides an opening for a diffusion while the protective layer in recess B masks the wafer from the diffusion; the diffused area is shown as 40 in FIG. 7*a*. If the second protective layer 20 at recess B is doped, a diffusion at slot B can be accomplished merely by heating the wafer to the appropriate temperature.

Figure 4C:
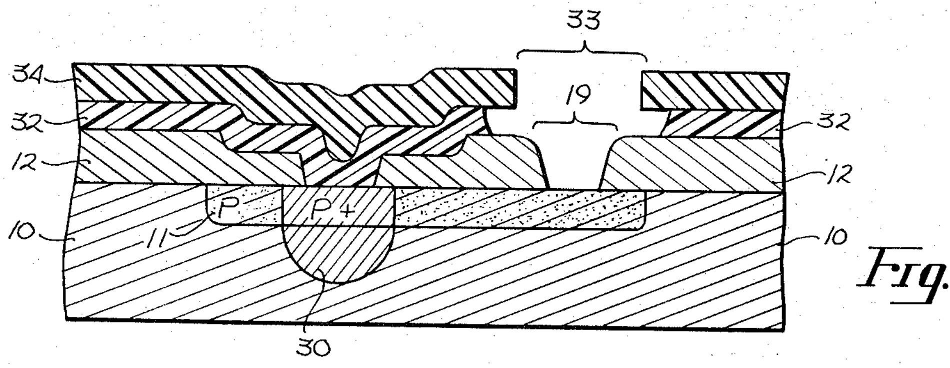
Figure 4D:
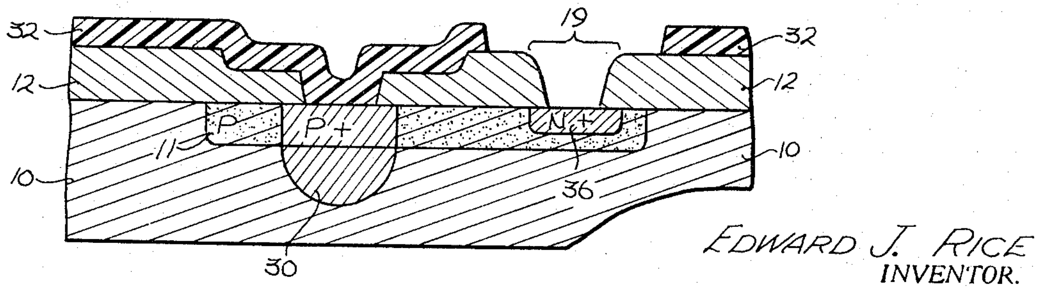
Figure 7A:
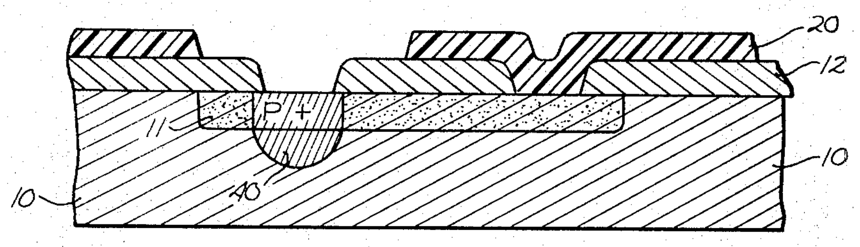
Figure 7B:
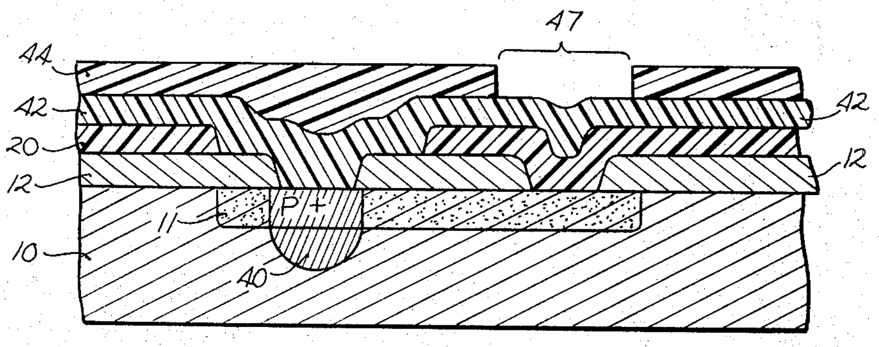
Figure 7C:
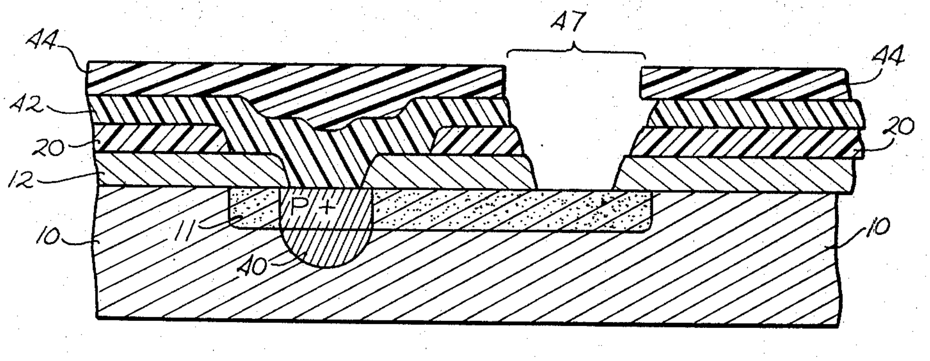
Figure 7D:
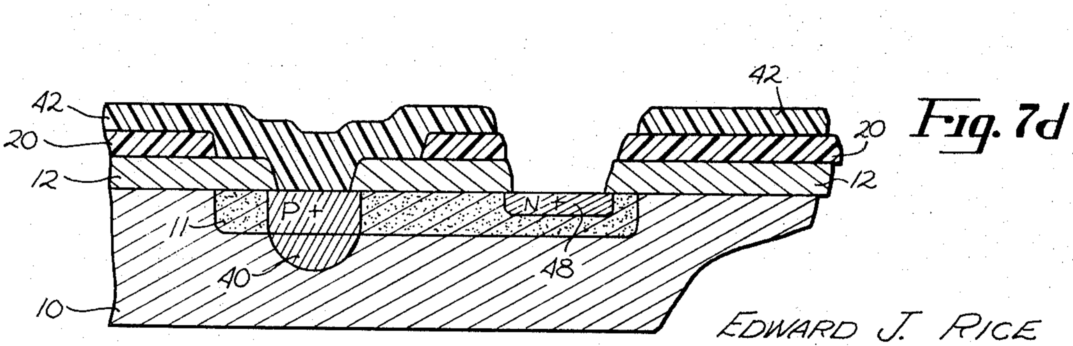

The method for diffusing into the recess defined by the image B is similar to that described for FIGS. 4*b* to 4*d*. After the diffusion into recess A has been completed as shown in FIG. 7*a*, a protective layer 42 is deposited over the protective layer 20, and also covers the exposed area on wafer 10 corresponding to image A, as hown in FIG. 7*b*. A photoreist layer 44 is then deposited and by use of standard photolithographic techniques, previously described, an opening 47 is produced in the photoresist layer in the area corresponding to image B, while covering the area corresponding to image A. The alignment of the third photomask again is accomplished by rather crude alignment since the image to be etched has been previously defined (see FIG. 7*b*). A suitable etching step is again performed and the area corresponding to image B is exposed. The photoresist layer 44 is then removed and a diffusion similar to that of FIG. 4*d* is performed forming thereby a diffused area 48. Thus, a conduction stripe 40 and an emitter region 48 may be diffused in precisely defined areas corresponding to images A and B without the multiple alignment problems inherent in the prior art methods.

In the above-described manner a series of patterns corresponding to recesses A and B can be etched across the entire width of a silicon wafer in a single photoresist and etching operation. In every case the precise dimension and spacing of images A and B will be reproduced upon the semiconductor surface. While the present application has described diffusion operations into the images defined by A and B, it should be understood that other operations such a alloying epitaxial growth, etc., could also be accomplished by the same basic techniques.

The advantages of the present invention lie in the extreme accuracy with which geometrical patterns can be placed on a semiconductor wafer. Using the present method, geometrical patterns can be accomplished with accuracy in two dimensions to the tolerances of the photoresist mask. This can be done repeatedly and uniformly within individual devices and across a wafer. The disadvantages of the prior art methods lie in the inaccuracies of manual multiple alignments. That is, in prior art methods, the first pattern such as recess A is etched completely across a wafer or within a device and then in separate photoresist operations successive patterns such a recess B must be precisely and manually aligned to produce an array of patterns required for a semiconductor device. Prior art methods produce unsymmetrical geometries and in general poor electrical characteristics. These disadvantages have been overcome by the present invention which necessitates only crude alignment of successive photomasks for photoresist operations.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

What is claimed is:

1. A method of providing a simplified alignment procedure in photoresist operations comprising the steps of:

(a) utilizing a first photomask containing multiple images to form a first pattern on a surface of a semiconductive material by exposing said surface through said first photomask;

(b) crudely aligning a second photomask, containing a given number of images less than all the images on said first mask, the images on said second photomask corresponding to given images on said first mask;

(c) etching those portions of said surfaces which correspond to images on said first photomask which are aligned on said second photomask;

(d) providing a junction between two regions of different conductivities on said exposed surface corresponding to the aligned images of said first and second photomasks;

(e) covering said exposed surfaces with a protective layer;

(f) crudely aligning a third photomask containing a given number of images less than all the images on said first mask, the images on the third photomask not corresponding to images on said second mask; and (g) etching those portions of said surface which correspond to images on said first photomask which are aligned with images on said third photomask, providing a junction between two regions of different conductivities on the exposed surface corresponding to the aligned images of said first and third photomask.

2. The method of claim 1 in which the etching is effected by chemical etching.

3. The method of claim 2 in which providing a junction between two regions of different conductivities is a diffusion with given dopants, thereby producing diffused areas with electrical characteristics different from those of the surface of said semiconductive material.

4. The method of claim 2 in which providing a junction is by epitaxial growth.

5. A simplified photolithographic technique for semiconductor devices comprising the steps of:

(a) providing a semiconductive material having a first protective layer on a surface;

(b) exposing through a mask to form a first pattern on the first protective layer, said first pattern containing multiple element images to be eventually formed on said semiconductive material;

(c) etching a predetermined depth of said protective layer in the area adjacent said first pattern;

(d) exposing through a mask to form a second pattern which contains less than all of the element images of said first pattern, said second pattern being such that it crudely aligns with those element images on said first pattern which will be next processed;

(e) etching the remaining protective layer only in the areas adjacent said aligned element images, so that the surface of the semiconductive material is exposed only in that area defined by the aligned images;

(f) providing a first junction between two regions of different conductivities on said exposed surface;

(g) depositing over said first protective layer, a second protective layer, said second protective layer covering the area on which said first junction was provided;

(h) exposing through a mask to form a third pattern which contains some of the element images of said first pattern but none of the element images which were involved in said first provided junction, said third pattern being such that it crudely aligns with those element images of said first pattern which will be next processed;

(i) etching the remaining protective layers only in the areas adjacent said aligned element images of the previous step, so that the said surface of the semiconductive material is exposed only in that area defined by the aligned images of the previous step; and (j) providing a second junction between two regions of different conductivities on said exposed area defined by the previous step.

6. The method of claim 5 in which providing a junction is by epitaxial growth.

7. The method of claim 5 in which the etching of the protecting layers is effected by chemical etching.

8. The method of claim 5 in which said semiconductive material contains at least one region on said surface of a conductivity type different from the rest of said semiconductive material.

9. The method of claim 8 in which said region is a diffused base region.

10. The method of claim 8 in which the said element images are imposed on said regions.

11. The method of claim 5 in which providing a second junction between two regions of different conductivities involves diffusion into said exposed areas of said semiconductive material.

12. A simplified photolithographic technique for semiconductor devices comprising the steps of:

(a) providing a semiconductive material having a first protective layer on a surface;

(b) exposing through a mask to form a first pattern on said first protective layer, said first pattern containing multiple images to be eventually formed on said semiconductive material;

(c) etching the portions of said first protective layer which are aligned with said first pattern, thereby exposing on the semiconductive material said first pattern;

(d) depositing over said first protective layer a second protective layer, said second protective layer covering the exposed semiconductive material;

(e) exposing through a mask to form a second pattern which contains less than all of the element images of said first pattern, said second pattern being such that it crudely aligns with those element images on said pattern which will be next processed;

(f) etching the portions of said second protective layer in the areas adjacent said aligned element images, so that the said surface of the semiconductive material is exposed only in that area defined by the aligned images;

(g) providing a first junction between two regions of different conductivities on said exposed surface;

(h) depositing over said second protective layer a third protective layer, said third protective layer covering the area on which said junction was provided;

(i) exposing through a mask to form a third pattern which contains at least some of the element images of said first pattern but none of the element images involved in said previously provided first junction, said third pattern being such that it crudely aligns with those element images of said first pattern which will be next processed; and (j) etching the portions of said second and third protective layers in the areas adjacent said aligned element images so that the upper surface of the semiconductive material is exposed only in the area defined by the aligned images of the previous step providing a second junction between two regions of different conductivities on the exposed area of the previous step.

13. The method of claim 12 in which the etching of the protective layers is effected by chemical etching.

14. The method of claim 12 in which said semiconductive material contains at least one region on said surface of a conductivity type different from the rest of said semiconductive material.

15. The method of claim 14 in which said region is a diffused base region.

16. The method of claim 12 in which providing a junction into said exposed areas of said semiconductive material is by epitaxial growth.

17. The method of claim 12 in which providing a junction between two regions of different conductivities involves diffusion into said exposed areas of said semiconductive material.

18. A simplified photolithographic technique for semiconductor devices comprising the steps of:

(a) providing a semiconductive material having a first protective layer on a surface;

(b) exposing through a mask to form a first pattern on said first protective layer, said first pattern containing multiple element images to be eventually formed on said semiconductive material;

(c) etching a predetermined depth of said protective layer in the areas adjacent said first pattern;

(d) exposing through a mask to form a second pattern which contains less than all of the element images of said first pattern, said second pattern being such that it crudely aligns with those element images on said first pattern which will be next processed;

(e) etching the remaining protective layer only in the area adjacent said aligned element images, so that the surface of the semiconductive material is exposed only in the area defined by the aligned images; and (f) providing a first junction between two regions of different conductivities on said exposed surface.

19. A simplified photolithographic technique for semiconductor devices comprising the steps of:

(a) providing a semiconductive material having a first protective layer on a surface;

(b) exposing through a mask to form a first pattern on said first protective layer, said first pattern containing multiple element images to be eventually formed on said semiconductive material;

(c) etching the portions of said first protective layer which are aligned with said first pattern thereby exposing on the semiconductive material said first pattern;

(d) depositing over said first protective layer a second protective layer, said second protective layer covering the exposed semiconductive material;

(e) exposing through a mask to form a second pattern which contains less than all of the element images of said first pattern, said second pattern being such that it crudely aligns with those element images on said pattern which will be next processed;

(f) etching the portions of said second protective layer in the area adjacent said aligned element images so that the said surface of the semiconductive material is exposed only in that area defined by the aligned images; and (g) providing a first junction between two regions of different conductivities on said exposed surface.

References Cited

UNITED STATES PATENTS 3,352,726 11/1967 Luce ---------------- 148—187
2,854,336 9/1958 Gutknecht ------------ 96—36

GEORGE F. LESMES, Primary Examiner

M. B. WITTENBERG, Assistant Examiner

U.S. Cl. X.R.

96—38.4, 44; 156—11, 17